United States Patent
Kawakita

(10) Patent No.: US 6,792,852 B2
(45) Date of Patent: Sep. 21, 2004

(54) VACUUM PRINT SYSTEM

(75) Inventor: Hiroshi Kawakita, Aichi (JP)

(73) Assignee: Noda Screen Co., Ltd., Aichi (JP)

( * ) Notice: Subject to any disclaimer, the term of this patent is extended or adjusted under 35 U.S.C. 154(b) by 0 days.

(21) Appl. No.: 10/337,848

(22) Filed: Jan. 8, 2003

(65) Prior Publication Data

US 2003/0131741 A1 Jul. 17, 2003

(30) Foreign Application Priority Data

Jan. 15, 2002 (JP) .......................... 2002-006236

(51) Int. Cl.$^7$ ........................... B05C 17/04; B05C 3/00; B44B 5/00
(52) U.S. Cl. ........................... 101/123; 101/31; 101/35; 101/126; 101/389.1; 118/406; 118/500; 118/504; 269/21; 422/292; 454/187
(58) Field of Search ........................... 101/123, 35, 31, 101/126, 389.1; 422/292; 118/500, 406, 504; 269/21; 454/187

(56) References Cited

U.S. PATENT DOCUMENTS

| | | | | |
|---|---|---|---|---|
| 4,996,781 A | * | 3/1991 | Mishina et al. ............... | 34/74 |
| 5,141,212 A | * | 8/1992 | Beeding ....................... | 269/21 |
| 5,637,148 A | * | 6/1997 | Kuster et al. ................. | 118/64 |
| 5,779,794 A | * | 7/1998 | Thompson .................. | 118/213 |
| 5,792,268 A | * | 8/1998 | Averell ........................ | 118/500 |
| 5,792,435 A | * | 8/1998 | Mueller et al. ............. | 422/292 |
| 6,019,932 A | | 2/2000 | Kambara | |
| 6,042,623 A | | 3/2000 | Edwards | |
| 6,471,050 B2 | * | 10/2002 | Ikeda et al. ............... | 198/861.1 |
| 6,474,230 B2 | * | 11/2002 | Corrado ....................... | 101/35 |

FOREIGN PATENT DOCUMENTS

| | | |
|---|---|---|
| EP | 0892427 A2 | 1/1999 |
| JP | 6-97260 | 4/1994 |
| JP | 6-66350 | 8/1994 |
| JP | 11-298138 | 10/1999 |
| JP | 2000-202986 | 7/2000 |
| JP | 2001-127087 | 5/2001 |
| JP | 2001-267339 | 9/2001 |

* cited by examiner

Primary Examiner—Daniel J. Colilla
Assistant Examiner—Marvin P. Crenshaw
(74) Attorney, Agent, or Firm—Wenderoth, Lind & Ponack, L.L.P.

(57) ABSTRACT

A vacuum print system comprising: an outer shell to define an airtight inner space and having a closure door at a ceiling thereof; a printer provided in the airtight inner space; a worktable to supply a work to the printer provided in the airtight inner space operable to move; and an air exhaust system connected to the airtight inner space is disclosed.

The worktable is operable to move between a sealing position and a work supplying position. The worktable at the sealing position divides the airtight inner space into two airtight compartments, a first compartment having the closure door, and a second compartment having the printer provided therein and the air exhaust system connected thereto. The worktable at the work supplying position supplies the work to the printer.

Further, the closure door is operable to open to take the work in and out when the worktable is at the sealing position.

20 Claims, 10 Drawing Sheets

VACUUM PRINT SYSTEM

BACKGROUND OF THE INVENTION

1. Field of the Invention

The present invention relates to a vacuum print system. More specifically, the present invention relates to a vacuum print system to print on a work having holes and gaps on its surface, like a printed wiring board.

2. Description of the Prior Art

Several techniques have already been proposed to fill a resin into holes on a plate, such as a printed wiring board, and make its surface flat and even. For example, Japanese Patent No. 3198273 discloses a process to fill a resin into holes, including through holes and non-through holes, by printing on the plate in vacuumed circumstance followed by reducing the vacuum degree of the circumstance in order to introduce the resin deeply into the holes without leaving any unfilled void, by way of the differential pressure.

To print on a printed wiring board in vacuumed circumstance, a printer is usually provided in a sealed chamber. A worktable holding the printed circuit board thereon is carried into the chamber through a door of the chamber, and then, the door is closed before the chamber is evacuated by a vacuum pump and printing is conducted. After printing, the door is opened again and the worktable is carried out from the chamber to take out the printed wiring board.

The printer for a printed wiring board is usually large because it comprises a resin furnishing unit to feed a resin onto a substrate through an apertured plate, and a squeegee unit to run off on the apertured plate pushing the fed resin throughout the apertures onto a substrate. Consequently, the sealed chamber becomes huge to house the large printer. As the capacity of the chamber becomes bigger, it takes longer time to produce a vacuum inside of the chamber after carrying a printed wiring board into, resulting in lower productivity.

SUMMARY OF THE INVENTION

Taking the above-described matters into consideration, the present invention has been made. Therefore, an object of the present invention is to provide a vacuum print system with a simple construction, which can attain an excellent productivity at printing on a work having holes and gaps on its surface, like a printed wiring board.

The first aspect of the present invention is a vacuum print system comprising: an outer shell to define an airtight inner space; a printer to print on a work; a worktable to supply the work to the printer; and an air exhaust system to exhaust air in the airtight inner space. The outer shell has a closure door at a ceiling thereof. The printer and the worktable are provided in the airtight inner space, whereas the air exhaust system is connected to the airtight inner space. The worktable is operable to move between a sealing position and a work supplying position. The worktable at the sealing position divides the airtight inner space into two airtight compartments, a first compartment having the closure door, and a second compartment having the printer provided therein and the air-exhaust system connected thereto. The worktable at the work supplying position supplies the work to the printer. Further, the closure door is operable to open to take the work in and out when the worktable is at the sealing position.

The second aspect of the present invention is the vacuum print system of the first aspect, further comprising an additional air exhaust system connected to the airtight inner space at a portion which forms the first compartment when the worktable is at the sealing position. The additional air exhaust system exhausts air from the first compartment when the worktable is at the sealing position and the closure door is closed.

The third aspect of the present invention is the vacuum print system of the first or the second aspect, wherein the worktable divides the first compartment above the second compartment by sealing a linking opening at a bottom of the first compartment, and the worktable is operable to move vertically between the sealing position and a waiting position, and is also operable to move horizontally between the waiting position and the work supplying position. The waiting position is beneath the linking opening and in a horizontal plane common with the work supplying position.

The forth aspect of the present invention is the vacuum print system of any one of the first through third aspects, wherein the worktable comprises a plate-shaped print table to hold the work thereon, and a open-top box shaped frame to support the print table. When the worktable is at the sealing position, a fringe of the frame is pressed against throughout the periphery of the linking opening so as to close the linking opening tightly.

The fifth aspect of the present invention is the vacuum print system of any one of the first through forth aspects, wherein the closure door of the outer shell is in an open-bottom box shape and the open-bottom thereof forms the linking opening.

The advantages of the vacuum print system according to the present invention will be described in the following:

First, the vacuum print system according to the first aspect of the present invention will be mentioned. Prior to carrying a work into the vacuum print system, the airtight inner space defined by the outer shell is vacuumed by the air exhaust system, and divided into two airtight compartments by the worktable at the sealing position. The two compartments are the first compartment having the closure door, and the second compartment having the printer provided therein and the air-exhaust system connected thereto. Then, the closure door of the first compartment is opened and a work is placed onto the worktable, while keeping the vacuum in the second compartment. After closing the closure door, the worktable is moved from the sealing position to the work supplying position, and supplies the work to the printer. With the worktable being moved from the sealing position, the first and second compartments are linked each other and air can flow freely within the airtight inner space. However, air from the atmosphere external to the outer shell is prevented from entering into the airtight inner space because the closure door is closed. Thus, the space where the printer is provided therein (the second compartment) is never opened toward atmosphere. In the case where an additional air exhaust system is connected to the airtight inner space at a portion which forms the first compartment when the worktable is at the sealing position and the closure door is closed, like the vacuum print system of the second aspect of this invention, the first compartment can be exhausted prior to moving the worktable to link the two compartments. In that case, air from the first compartment is also prevented from entering the second compartment. However, if the capacity of the first compartment is much smaller than that of the second compartment, it is not necessary to exhaust air in the first compartment because the volume of air which would enter into the second compartment from the first compartment is relatively small.

Thereafter, printing on to the work is conducted to fill a resin into the holes on the surface of the work. After printing, the worktable is returned to the sealing position. Then, the closure door of the first compartment is opened to take the work out, and if desired, another work will be carried into the system. In this step, the closure door is opened again to take the work out. However, with the second compartment being sealed by the worktable at the sealing position, the space where the printer is provided therein (the second compartment) is never opened toward atmosphere. When the printed work is taken out to atmosphere, a differential pressure would be generated because the printing of the resin into the holes on the surface of the work has been conducted under vacuum. The differential pressure would introduce the printed resin deeply into the holes without leaving any void.

As described above, a work can be carried into and out from the vacuum print system of the first aspect, with keeping the high vacuum degree in the major portion of the airtight inner space where the large printer is provided therein. It means exhausting the entire airtight inner space at each printing of a work is not necessary with this vacuum print system. Therefore, the time required to exhaust air is greatly shortened and the productivity is greatly improved.

Further, according to the vacuum print system of the present invention, a dividing door between the first and second compartments is not necessary because the worktable to carry a work also serves to divide the compartments. Therefore, the vacuum print system of this invention has a simple construction and a large design freedom, and has a great advantage of lower production cost of the whole system.

According to the second aspect of the present invention, the vacuum print system further comprises an additional air exhaust system connected to the airtight inner space at a portion which forms the first compartment. The first compartment can be exhausted while the worktable is at the sealing position prior to moving the worktable to open the linking opening, reducing the burden of the air exhaust system to vacuum the entire airtight inner space.

In the vacuum print system according to the third aspect of the present invention, the worktable divides the first compartment above the second compartment by sealing the linking opening at the bottom of the first compartment. The worktable is operable to move vertically between the sealing position and the waiting position, and is also operable to move horizontally between the waiting position and the work supplying position, tracing a letter "L". According to the third aspect of the present invention, the closure door to take a work into and out from the system can be placed at the side of the printer. Since the printer is usually large, the operation to take a work into and out from the vacuum print system of this construction is much easier than in the case with a vacuum print system having a closure door placed above the printer.

When the closure door is open, the worktable seals the second compartment from atmosphere. There is a possibility of decrease in the surface accuracy of the upperface of the worktable as a permanent deformation caused by the atmospheric pressure. According to the forth aspect of the present invention, the worktable comprises a plate-shaped print table and an open-top box shaped frame to support the print table. With this construction, the frame receives the stress caused by the atmospheric pressure, preventing the plate-shaped print table from being deformed, and keeping the precise surface accuracy of the upperface of the print table.

According to the fifth aspect, the closure door is in an open-bottom box shape and the open-bottom thereof forms the linking opening. The first compartment can be formed only with the closure door and the worktable at the sealing position. The construction of the system can be extremely simplified.

DETAILED DESCRIPTION OF THE PREFFERED EMBODIMENT

Figure 1:
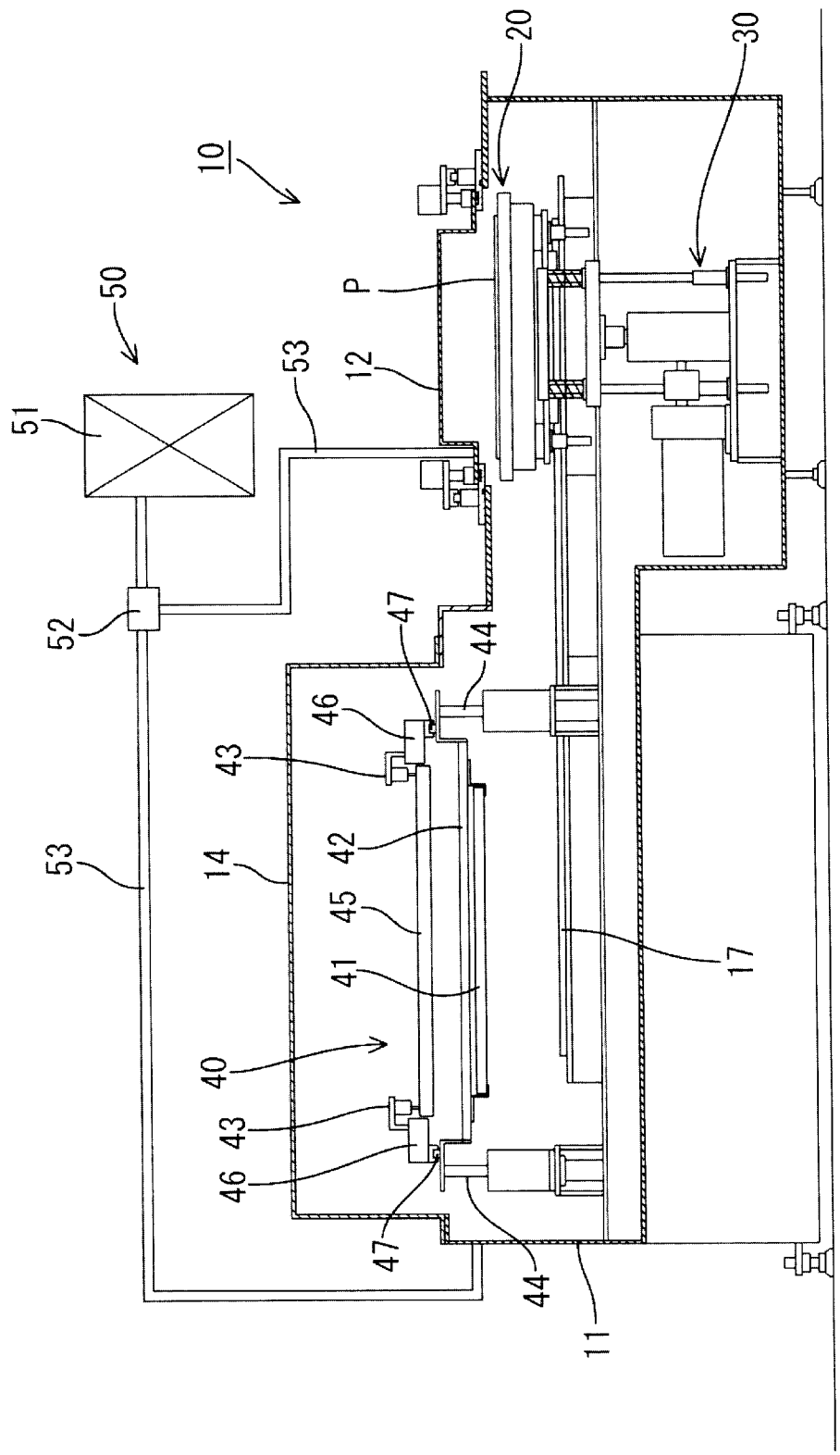
FIG. 1 shows schematic vertical sectional view taken longitudinally of the vacuum print system of one embodiment of the invention (the worktable is at the waiting position)

In the followings, one embodiment of the present invention will be described in detail with reference to FIGS. 1 through 9.

A vacuum print system 10 of the embodiment is the one for filling a resin, such as an insulating resin, into non-through holes, such as via holes, on the surface of a printed wiring board R The vacuum print system 10 has an outer shell 11 defining an airtight inner space. At a part of the ceiling of the outer shell 11, an open-bottom box shaped closure door 12 is provided operable to open, and the open-bottom of the closure door 12 forms a linking opening 13. At another part of the ceiling of the outer shell 11, a detachable cover 14 is provided.

In the airtight inner space, a printer 40 is disposed below the detachable cover 14. A worktable 20 is provided operable to move in the airtight inner space as described later.

The printer 40 comprises a plate holder 42, a squeegee driving unit 43, and a resin furnishing unit (not shown in the drawings). The plate holder 42 supports an apertured plate 41 having apertures at desired positions, and the resin furnishing unit feeds a print resin onto the apertured plate 41. There are four up-down rods 44 fixed respectively one at each of the four corners of the underface of the plate holder 42. The plate holder 42 and the squeegee driving unit 43 are operable to move up and down with the movement of the up-down rods 44 driven by an driving mechanism (not shown in the drawings). When the up-down rods 44 are in their bottom height, the apertured plate 41 is at a height to be almost touched on its underface by the printed wiring board P carried to a predetermined position by the worktable 20 as described later.

The squeegee driving unit 43 comprises runners 46 which hold a squeegee 45 in a hanging state. The runners 46 are operable to move perpendicularly to the sectional surface of FIG. 1 along with a pair of guide rails 47 provided at the upperface of the plate holder 42, and driven by a motor (not shown in the drawings). Printing begins with driving the runners 46. When the runners 46 are driven, the squeegee 45 is also driven to run off on the apertured plate 41 pushing the fed resin throughout the apertures of the apertured plate 41 onto a printed wiring board P.

Figure 9:
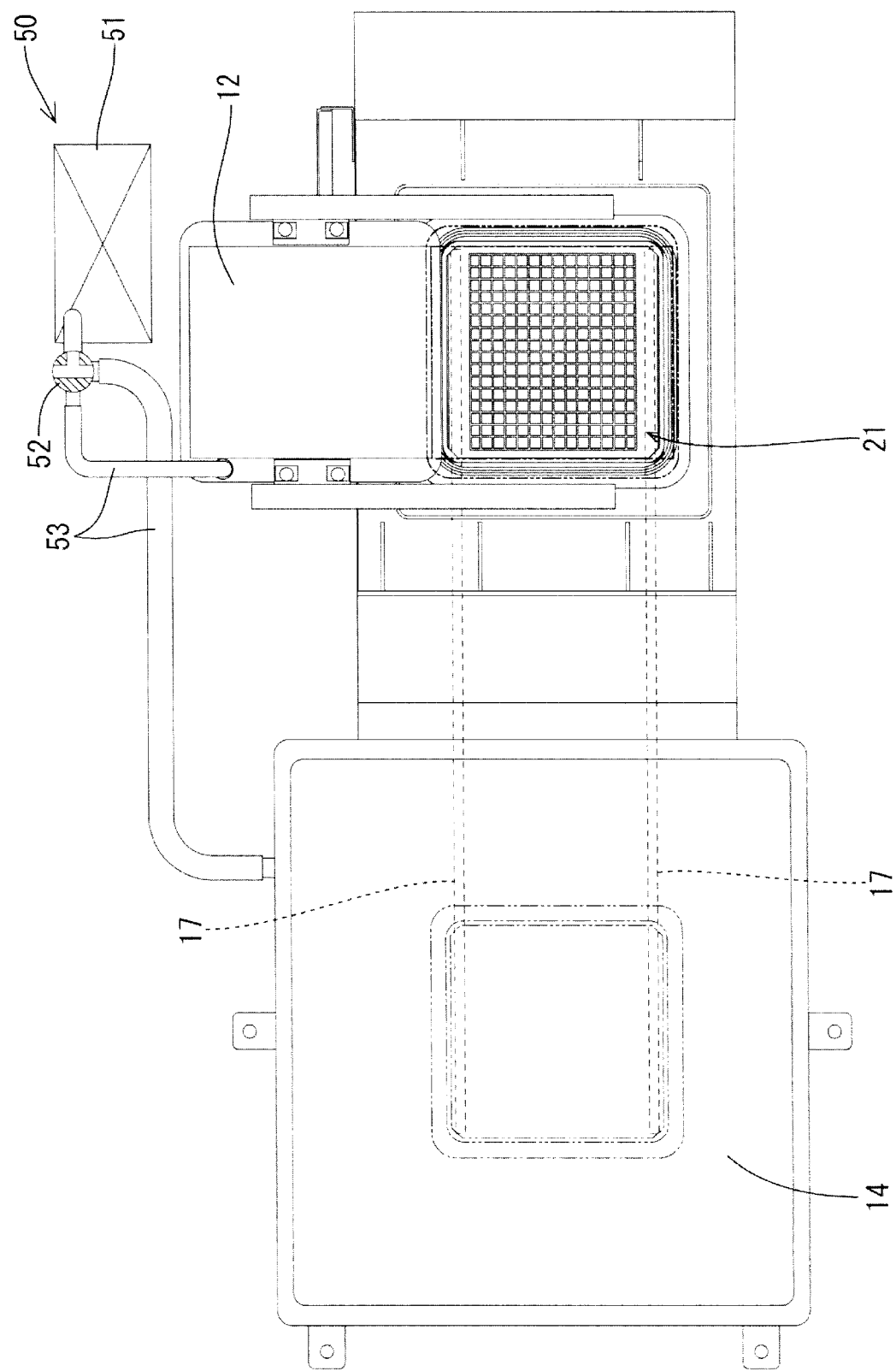
FIG. 9 shows schematic plan view of the vacuum print system of the embodiment.

Maintenance of the printer 40 is easy in the vacuum print system 10 of this embodiment, because the printer 40 is disposed below the detachable cover 14 (FIG. 9).

The worktable 20 comprises a print table 21 in a quadrangular plate shape, and a frame 22 in a planiform open-top box shape. The print table 21 holds a printed wiring board P thereon, and the frame 22 accommodates the print table 21 therein. On the upperface of the print table 21, grid-like grooves 21A are formed. An outwardly extending peripheral flange 22A is formed along the open-top of the frame 22. The flange 22A has a gasket 23 fitted throughout thereon. Below the print table 21 is a lifting device (not shown in the drawings) to operate the height of the print table 21. The upperface of the print table 21 is adjusted slightly above the top end surface of the frame 22. There are four guide pins 24 secured respectively one at each of the four corners of the underface of the frame 22, to be inserted into after-mentioned holes on connecting plates 18.

The worktable 20 is operable to move linearly horizontally between a work supplying position (FIG. 2) to supply a printed wiring board P to a predetermined position at the foot of the printer 40, and a waiting position (FIGS. 1, 5, and 6) beneath the linking opening 13 and in a horizontal plane common with the work supplying position. A pair of parallel guide rails 17 is provided horizontally between at the foot of the printer 40 and beneath the closure door 12. The guide rails 17 have a pair of connecting plates 18 operable to move along with the guide rails 17. The connecting plates 18 each extends outwardly from the guide rails 17 (FIG. 6). These extending parts have holes to receive the above-mentioned guide pins 24 with a clearance, and thereby, the connecting plates 18 and the worktable 20 are connected with each other. When a driving mechanism (not shown in the drawings) is activated, the worktable 20 moves horizontally between the work supplying position (FIG. 2) and the waiting position (FIG. 1) along with the guide rails 17.

The worktable 20 is also operable to move linearly vertically between the waiting position (FIGS. 1, 5, and 6), and a sealing position (FIGS. 3, 7, and 8) to be pressed against the periphery of the linking opening 13 to seal it. Below the linking opening 13 is a lifting device 30 to bring the worktable 20 up and down as shown in detail in FIGS. 5 through 8. The lifting device 30 has a motor 31, an up-down cylinder 33, and a supporting plate 34. The up-down cylinder 33 is on a cylinder table 32, and is moved up and down by the motor 31. The underface of the supporting plate 34 contacts with the upperface of the up-down cylinder 33 so as to move with it. Each of the cylinder table 32 and the supporting plate 34 has four holes at the vertically same positions to receive four up-down rods 35 with a clearance. The upper part of each of the four up-down rods 35 extending upwardly of the supporting plate 34 fits into and passes through a coil spring 36. The top ends of the up-down rods 35 are fixed to a horizontal plate-shaped worktable support 37. Therefore, the worktable support 37 and the supporting plate 34 are kept at a distance same with the length of the coil springs 36. The worktable support 37 holds the worktable 20 thereon.

Figure 5:
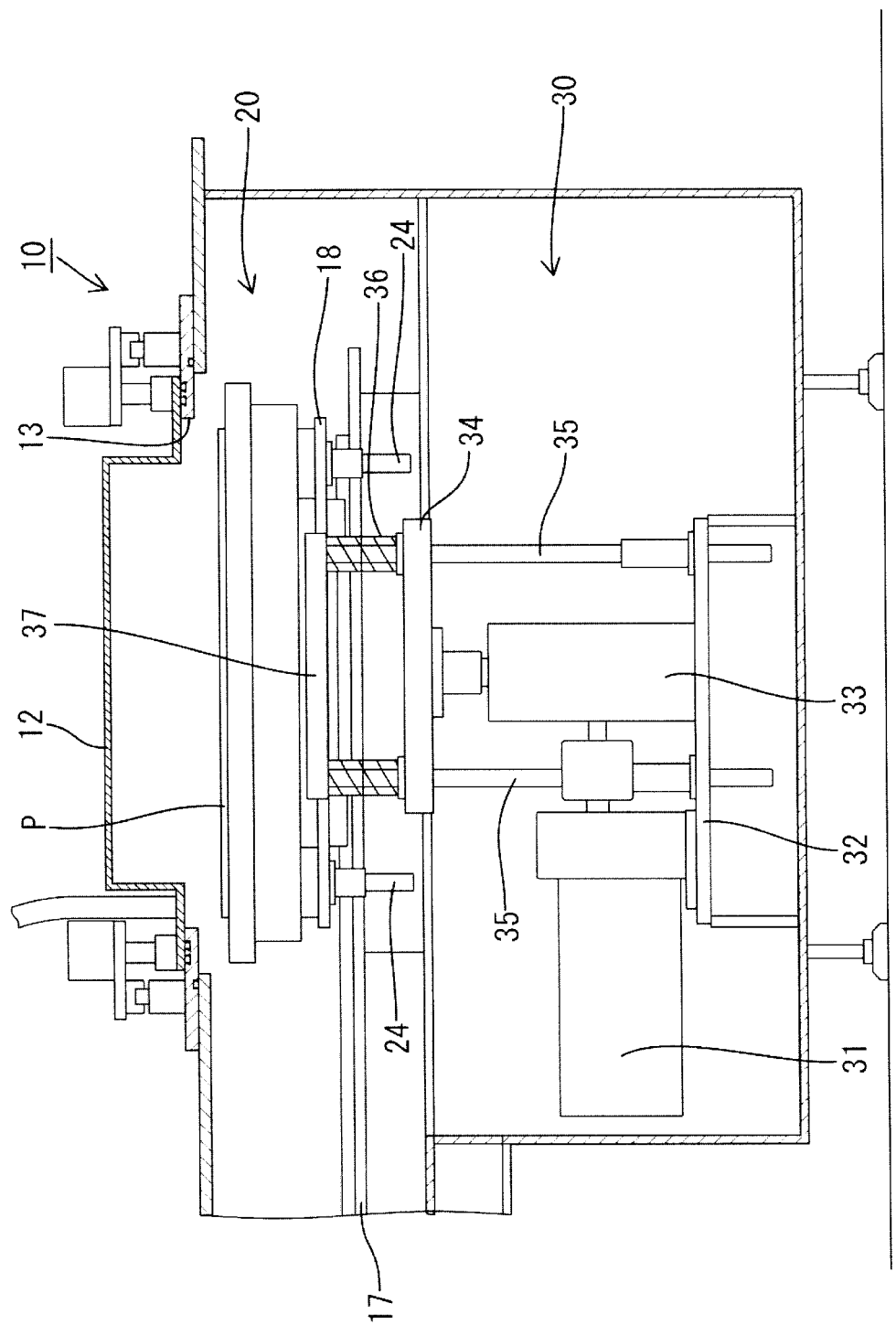
FIG. 5 shows partial schematic sectional view taken transversely of the vacuum print system of the embodiment including the closure door (the worktable is at the waiting position)
Figure 6:
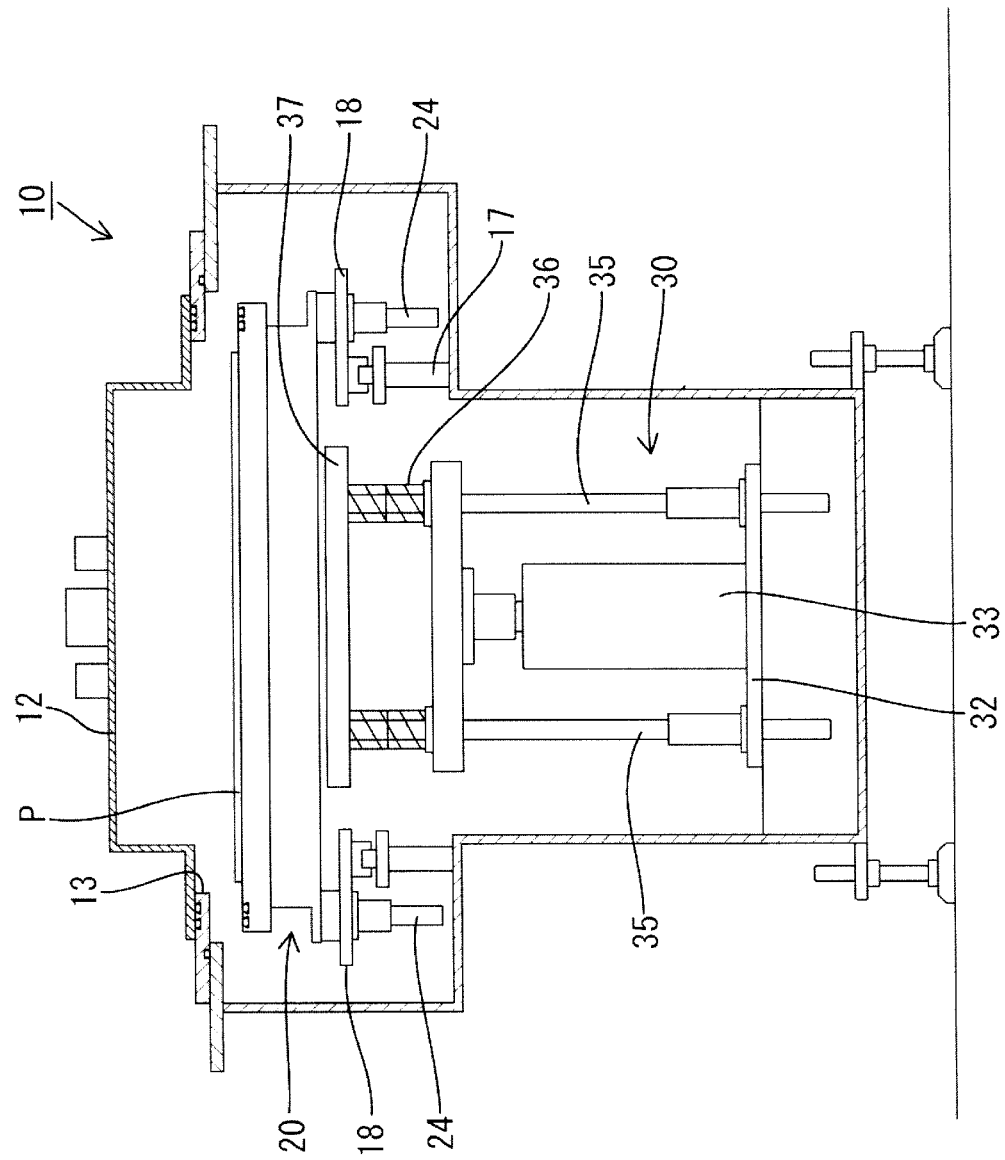
FIG. 6 shows partial schematic sectional view taken longitudinally of the vacuum print system of the embodiment including the closure door (the worktable is at the waiting position)
Figure 7:
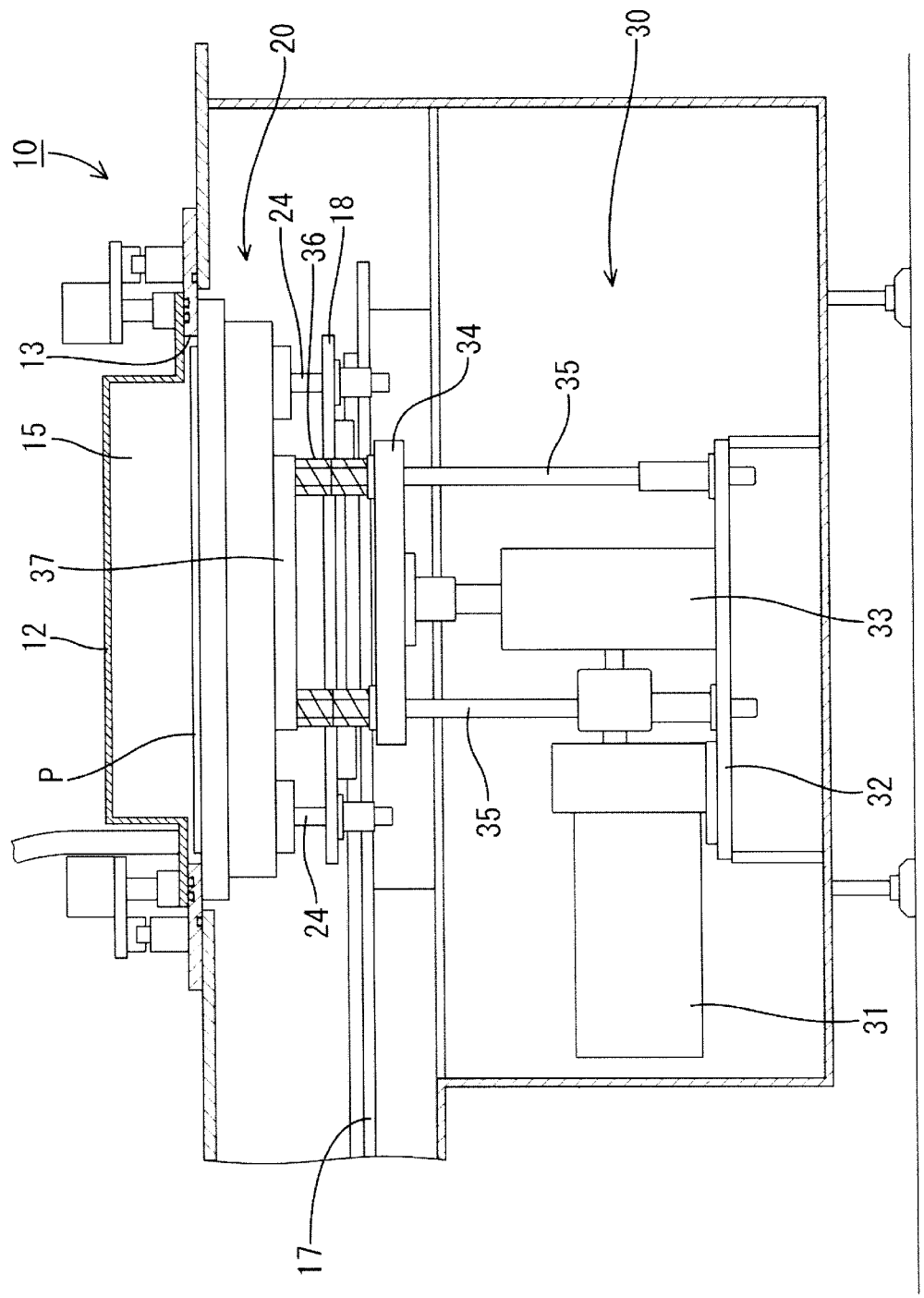
FIG. 7 shows partial schematic sectional view taken transversely of the vacuum print system of the embodiment including the closure door (the worktable is at the sealing position)
Figure 8:
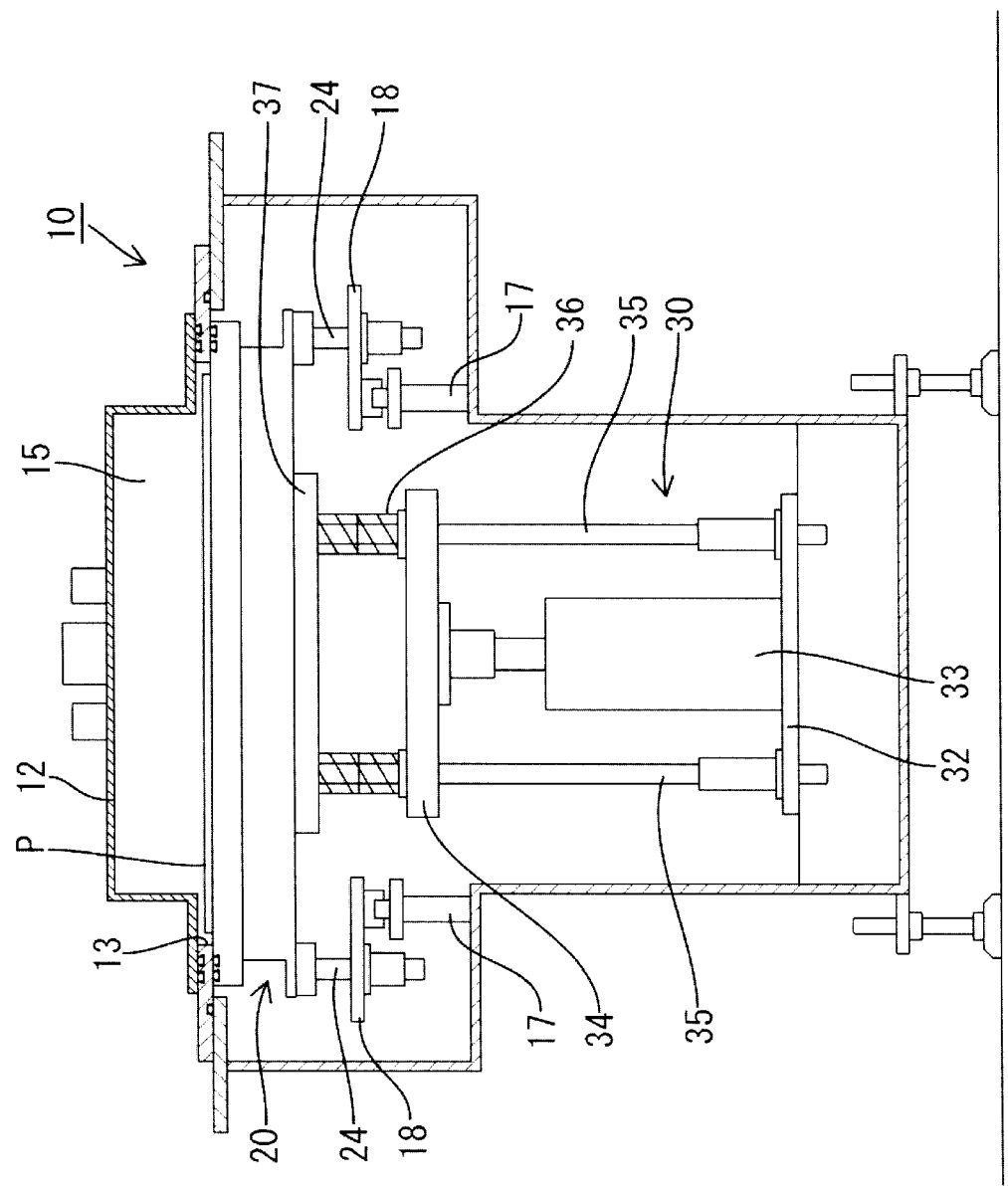
FIG. 8 shows partial schematic sectional view taken longitudinally of the vacuum print system of the embodiment including the closure door (the worktable is at the sealing position)

When the up-down cylinder 33 is at its bottom height, the worktable support 37 is apart from the underface of the worktable 20 (FIGS. 5 and 6). In other words, when the up-down cylinder 33 is at its bottom height, the worktable 20 is supported not by the worktable support 37 but by the connecting plates 18 on the guide rails 17. Thus, the worktable 20 is operable to move horizontally along with the guide rails 17. When the up-down cylinder 33 is at its top height, the upperface of the frame 22 of the worktable 20 is pressed against throughout the periphery of the linking opening 13 through the intermediary of the gasket 23, to seal the linking opening (FIGS. 7 and 8).

Figure 3:
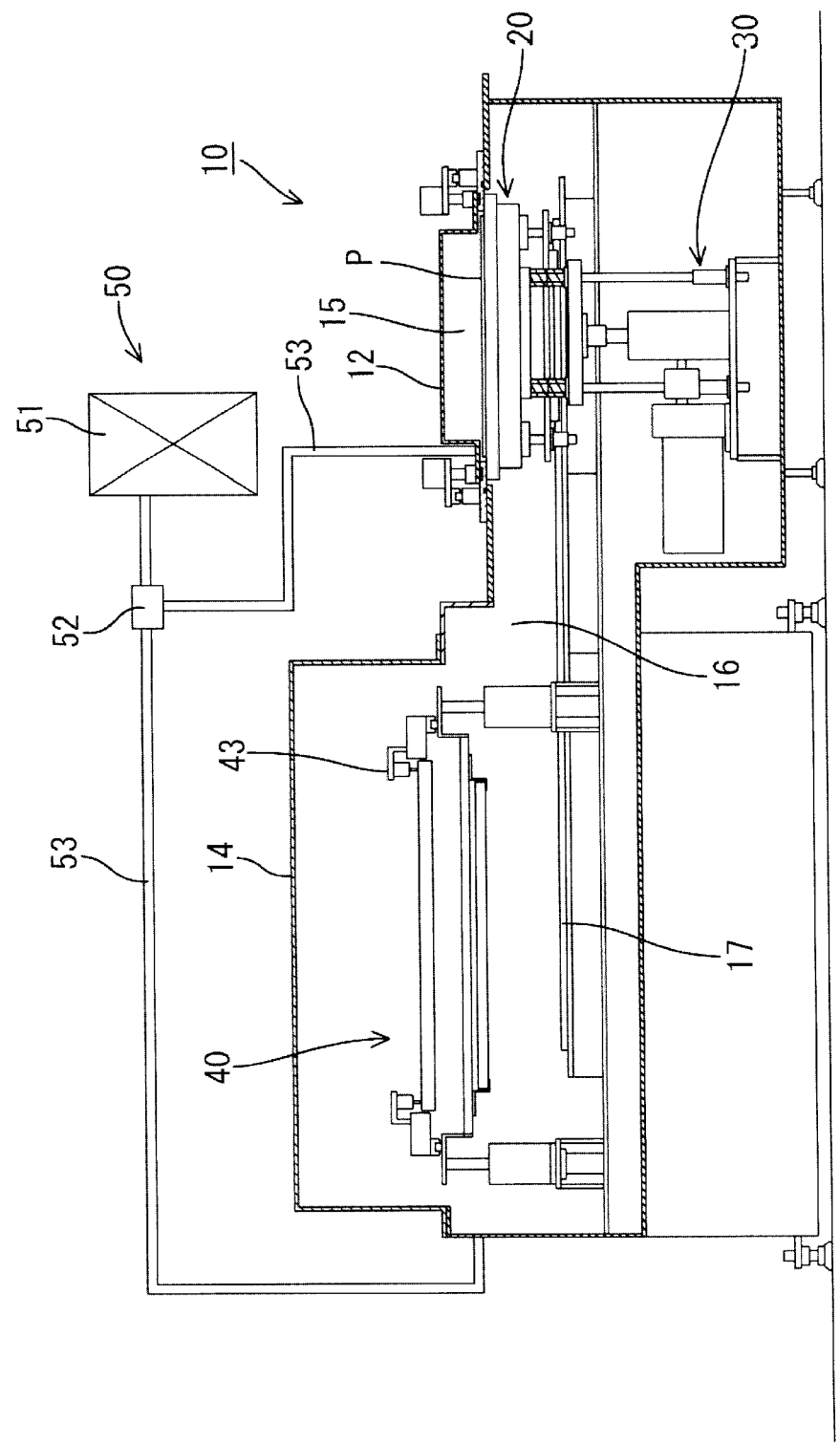
FIG. 3 shows schematic vertical sectional view taken longitudinally of the vacuum print system of the embodiment (the worktable is at the sealing position)
Figure 4:
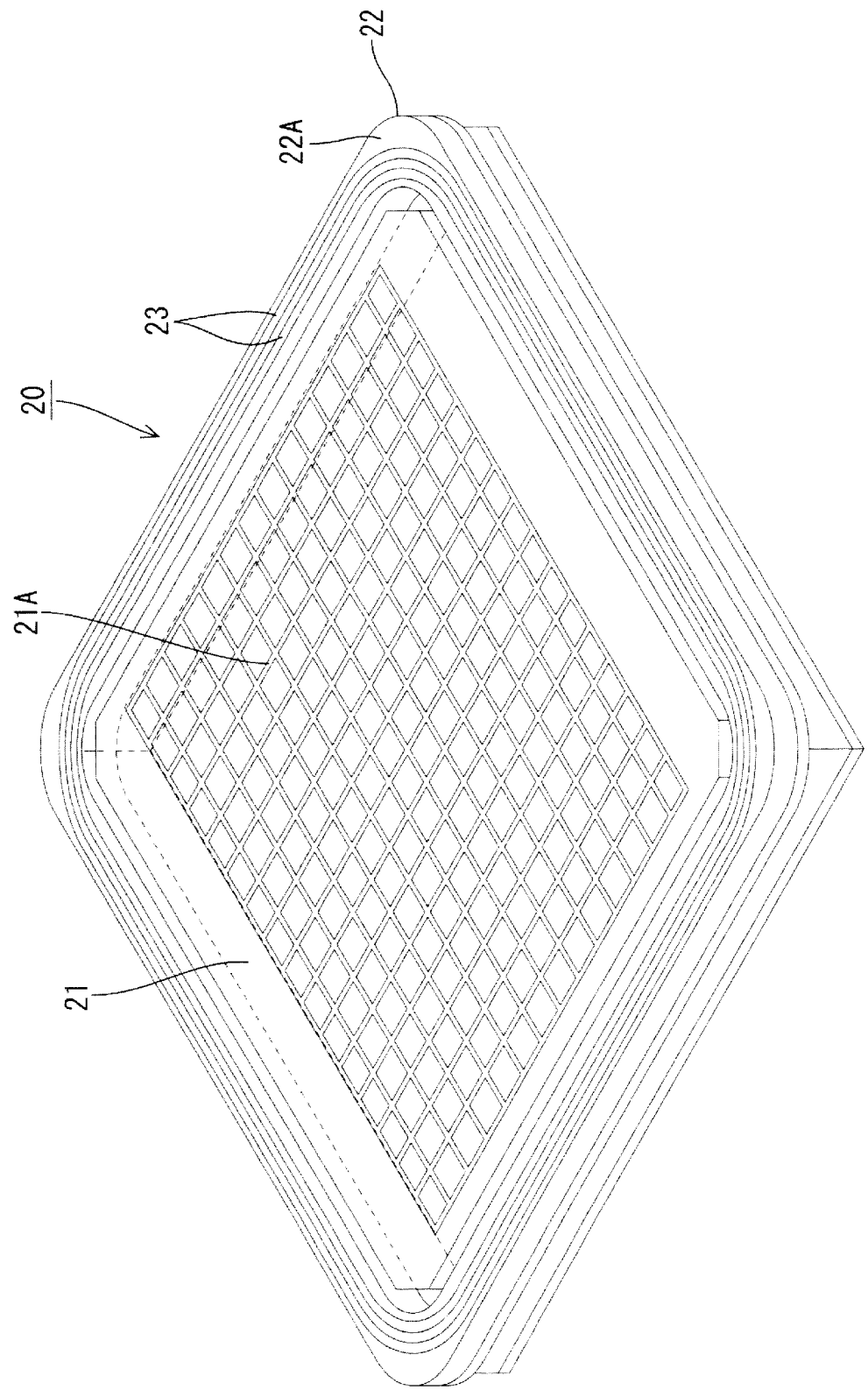
FIG. 4 shows perspective view of the worktable of the vacuum print system of the embodiment.

The airtight inner space defined by the outer shell 11 is divided into two compartments, a first compartment 15 and a second compartment 16, by sealing the linking opening 13 with the worktable 20 (FIG. 3). The first compartment 15 is defined only by the open-bottom box shaped closure door 12 and the worktable 20 at the sealing position. The second compartment 16 is the rest of the airtight inner space, and has the printer 40 provided therein. The closure door 12 of the first compartment 15 is operable to open by being moved up with a driving mechanism (not shown in the drawings) before being slid perpendicularly to the sectional surface of FIG. 3 (FIG. 9).

An air exhaust system 50 comprises a vacuum pump 51, a switching valve 52, and air hoses 53. The air hoses 53 are connected to the airtight inner space at two portions each forms the first or the second compartment (FIG. 3). Therefore, it is possible to selectively exhaust the first compartment 15 and the second compartment 16, and to introduce air into the second compartment 16 by opening an air supply valve (not shown in the drawings).

In the following, the printing process onto a printed wiring board P with the vacuum print system 10 of this embodiment will be described.

Before a printed wiring board P is carried into, the vacuum print system 10 of this embodiment is in the state shown in FIGS. 3, 7 and 8 except for the absence of the printed wiring board P in those Figs. The airtight inner space defined by the outer shell 11 has been vacuumed by the air exhaust system 50. The lifting device 30 is at its top height, and the worktable 20 is at the sealing position. The supporting plate 34 is pushed up by the up-down cylinder 33, and the coil springs 36 are compressed. The worktable support 37 and the worktable 20 are pushed up by the compressed coil springs 36, and the worktable 20 is pressed strongly against the periphery of the linking opening 13. In the state shown by FIGS. 3, 7, and 8, the closure door 12 of the first compartment 15 is closed to make both of the two compartments, the first compartment 15 and the second compartment 16, airtight.

(i) Carrying the Work into the Vacuum Print System

Prior to carrying the printed wiring board P into the vacuum print system 10 in the above-described state, an air supply valve (not shown in the drawings) of the first compartment 15 is opened to release the pressure in the first compartment 15 to the same level as atmospheric pressure, before the closure door 12 (FIG. 9) is opened. In this manner, the closure door 12 can be opened easily without the stress induced by the pressure difference. In this step, the closure door 12 is opened. However, the second compartment 16 is never opened toward atmosphere with the linking opening 13 being sealed by the worktable 20.

Through the opened closure door 12, the printed wiring board P is placed onto the worktable 20, and then, the closure door 12 is closed (FIGS. 3, 7, and 8).

(ii) Supplying the Work to the Printer

After carrying the printed wiring board P into the vacuum print system, the air exhaust system 50 is activated and the air in the first compartment 15 is exhausted to the same vacuum degree as in the second compartment 16.

Figure 2:
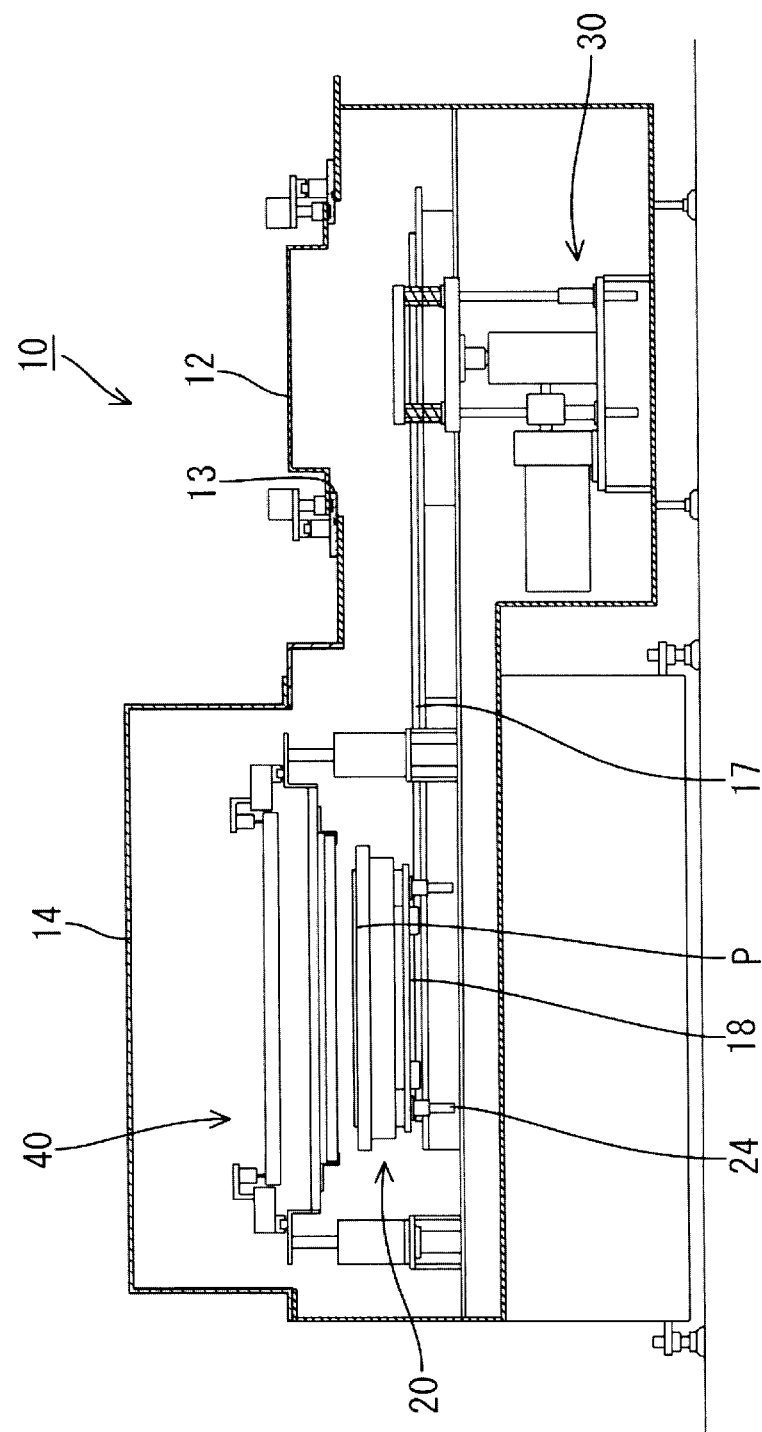
FIG. 2 shows schematic vertical sectional view taken longitudinally of the vacuum print system of the embodiment (the worktable is at the work supplying position)

After the desired vacuum degree is attained in the first compartment 15, the lifting device 30 is moved down to bring the worktable 20 down and open the linking opening 13. The lifting device 30 is further moved down to its bottom height to bring the worktable 20 down to the waiting position. When the worktable 20 is at the waiting position, the worktable 20 is supported not by the worktable support 37 but by the connecting plates 18 (FIGS. 5 and 6). Then, the worktable 20 is moved horizontally along with the guide rails 17 to the predetermined position (the work supplying position) at the foot of the printer 40 (FIG. 2).

In this manner, with the first compartment 15 having been exhausted before sending the worktable 20 down to open the linking opening 13, air can be prevented from entering the second compartment 16 from the first compartment 15.

(iii) Printing onto the Work

After moving the worktable 20 to the predetermined position, the up-down rods 44 of the printer 40 are moved down while a resin is fed onto the apertured plate 41 from a resin furnishing nozzle (not shown in the drawings). Then, the runners 46 are driven to make the squeegee 45 running off on the apertured plate 41 filling the resin into holes on the printed wiring board P. The via holes on the printed wiring board P are so small that unfilled voids are likely to remain in these micropores having been filled with the resin by means of the primary printing process like described above.

(iv) Carrying Out the Work from the Vacuum Print System

After the printing resin onto the printed wiring board P, the up-down rods 44 are moved up to bring up the runners 46 and the squeegee 45 to their initial positions. The worktable 20 is horizontally moved again along with the guide rails 17 to the predetermined position beneath the linking opening 13 (the waiting position). Then, the lifting device 30 is moved up to bring the worktable 20 up with the worktable support 37, until the worktable 20 is pressed against the periphery of the linking opening 13. The worktable 20 is pushed up by the compressed coil springs 36 so that the first compartment 15 and the second compartment 16 are tightly divided by the worktable 20.

The air supply valve of the first compartment 15 is then opened to release the pressure in the first compartment 15 to the same level as the atmospheric pressure, before the closure door 12 is opened to take out the printed wiring board P. Though the closure door 12 is opened again, the second compartment 16 is never opened toward atmosphere with the linking opening 13 being sealed by the worktable 20.

It is likely that air-containing voids are remaining in the holes on the printed wiring board P having been filled with the resin. When the printed wiring board P is taken out to atmosphere, the resin would be introduced fully deeply into the holes by the differential pressure between the atmosphere and the voids, and would leave any void.

As described above, with the vacuum print system 10 of this embodiment, the airtight inner space defined by the outer shell 11 is divided into two compartments by the worktable 20. A work can be carried into and out from the vacuum print system 10 while keeping the vacuum in the second compartment 16, the major portion of the airtight inner space. Further, in this embodiment, the first compartment 15 can be exhausted prior to moving the worktable 20 down to open the linking opening 13. Therefore, the vacuum degree in the second compartment 16 can be maintained high, by preventing air from entering the second compartment 16 from the first compartment 15. The high vacuum degree of the airtight inner space can be maintained only by exhausting the small volumetric first compartment 15, without exhausting the large volumetric second compartment 16. It means, the time required to exhaust air in the airtight inner space can be greatly shortened resulting in a great improvement of productivity.

In the vacuum print system 10 of the present invention, the linking opening 13 between the first compartment 15 and the second compartment 16 is opened and sealed by the worktable 20 to carry the printed wiring board P. A door between the two compartments is not required in this vacuum print system 10 which allows the simple construction of the system. It increases the design freedom of the system, and enables production cost reduction.

In this embodiment, the worktable 20 comprises the print table 21 and the frame 22. With this construction, even in case where the frame 22 is deformed by the stress caused by the atmospheric pressure, the precise surface accuracy of the print table 21 would be kept high to prevent printing overlaps, and the quality of the printing would also be kept high.

The foregoing description and drawings are merely illustrative of the principles of the present invention and are not to be construed in a limiting sense. Various changes and modifications including the following are seen to fall within the scope of the invention as defined by the appended claims.

(1) In the foregoing embodiment, the vacuum print system is used to fill an insulating resin into via holes of a printed wiring board P. However, the vacuum print system of the present invention can be used, for example, to seal electronic parts mounted on a printed wiring board with a resin. With the vacuum print system of the present invention, it is possible to fill a resin effectively into every holes and gaps among the electronic parts and the printed wiring board. The resin to be filled is not limited, and any resin having various electrical and physical properties can be used. For example, the present invention is applied to fill conductive paste.

Figure 10:
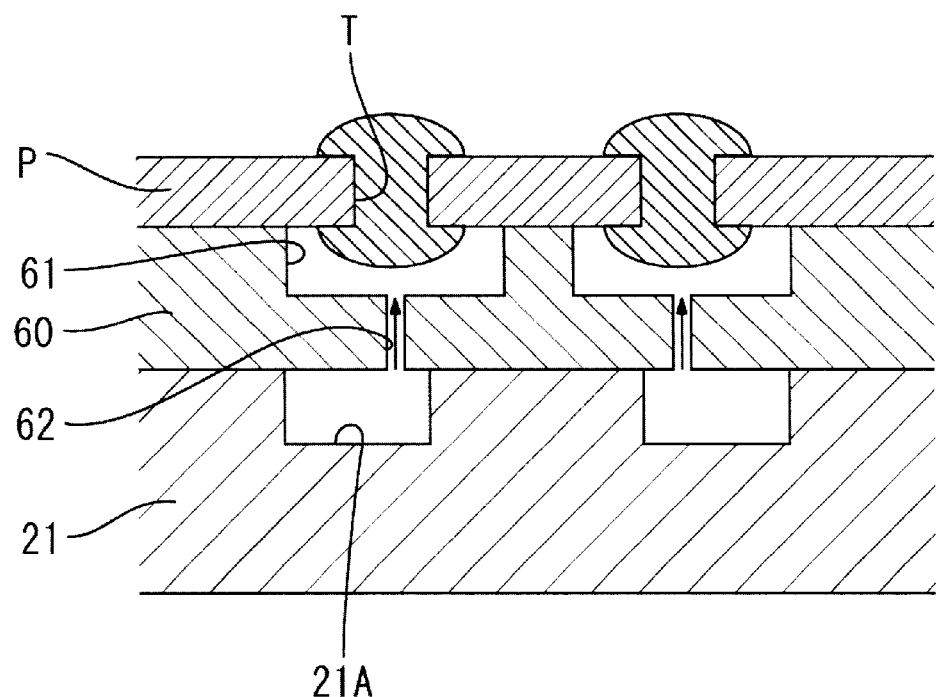
FIG. 10 shows enlarged vertical sectional view of the print table of another embodiment of the invention.

(2) In the foregoing embodiment, the vacuum print system is used to fill a resin into non-through holes. However, the vacuum print system of the present invention can be used to fill a resin into through holes, for example through holes T of a printed wiring board P. In this case, as shown in FIG. 10, an auxiliary template 60 can be used. The auxiliary template 60 has recesses 61 at the positions corresponding to the through holes T on the printed wiring board P, to relief the resin run out from the through holes T. Each of the recesses 61 has a through hole 62 at its bottom to link the recesses 61 and the grooves 21A on the print table 21. When the printing wiring board P is carried out from the vacuum print system after printing, the atmospheric pressure may be applied only to its upperface and may generate a large pressure difference between the two faces (upperface and underface) of the printing wiring board P. Even in such a case, with the above-described construction, the air in the grooves 21A would be drawn into the recesses 61 to relief the pressure difference, preventing the resin having been filled into through holes T from moving out.

(3) In the foregoing embodiment, the air exhaust system 50 is connected to the airtight inner space not only at the portion which forms the second compartment 16 but also at the portion which forms the first compartment 15. However, if the capacity of the first compartment 15 is quite smaller than that of the second compartment 16, exhausting the air in the first compartment 15 would be unnecessary. On the other hand, if the air exhaust system connected to the first compartment 15 is needed, the vacuum pump 51 to exhaust the second compartment 16 can be shared by providing the switching valve 52 as the foregoing embodiment, or two vacuum pumps for each of the first compartment 15 and the second compartment 16 can be provided.

In the foregoing embodiment, the printed resin is pushed into the holes by taking the printed wiring board P out to atmosphere. That is because a differential pressure is generated between atmosphere and voids having been remaining in the holes, which introduces the resin deeply into the holes. However, a differential pressure can be generated by changing the vacuum degree in the airtight inner space instead of taking the printed wiring board P out to atmosphere. For example, an air supply/exhaust system can be connected to the airtight inner space nearby the printer 40. After printing onto a work, an air supply valve can be opened and the vacuum degree in the airtight inner space would be decreased to introduce the printed resin into holes by the differential pressure. Then, the vacuum degree in the airtight inner space can be increased again, before applying the resin again in a volume equal to the resin having been pushed into the holes for filling in the voids. In this process, the vacuum degree is not necessarily decreased to atmospheric pressure so that increasing the vacuum degree again would not take so long time.

What is claimed is:

1. A vacuum print system comprising:
    an outer shell to define an airtight inner space, and having a closure door at a ceiling thereof,
    a printer provided in the airtight inner space,
    a worktable to supply the work to the printer, and provided in the airtight inner space operable to move,
    an air exhaust system connected to the airtight inner space,
    wherein
        the worktable is operable to move between a sealing position to divide the airtight inner space into two airtight compartments, a first compartment having the closure door, and a second compartment having the printer provided therein and the air-exhaust system connected thereto, and a work supplying position to supply the work to the printer,
        and the closure door is operable to open to take the work in and out when the worktable is at the sealing position.

2. The vacuum print system according to claim 1, further comprising an additional air exhaust system connected to the airtight inner space at a portion which forms the first compartment when the worktable is at the sealing position, to exhaust air from the first compartment when the worktable is at the sealing position and the closure door is closed.

3. The vacuum print system according to claim 2, wherein the worktable divides the first compartment above the second compartment by sealing a linking opening at a bottom of the first compartment, and the worktable is operable to move vertically between the sealing position and a waiting position beneath the linking opening and in a horizontal plane common with the work supplying position, and is also operable to move horizontally between the waiting position and the work supplying position.

4. The vacuum print system according to claim 3, wherein the worktable comprising:
    a plate-shaped print table to hold the work thereon, and
    an open-top box shaped frame to support the print table;
    and a fringe of the frame is pressed against throughout the periphery of the linking opening so as to close the linking opening tightly when the worktable is at the sealing position.

5. The vacuum print system according to claim 4, wherein the closure door of the outer shell is in an open-bottom box shape and the open-bottom thereof forms the linking opening.

6. The vacuum print system according to claim 3, wherein the closure door of the outer shell is in an open-bottom box shape and the open-bottom thereof forms the linking opening.

7. The vacuum print system according to claim 2, wherein the worktable comprising:
    a plate-shaped print table to hold the work thereon, and
    an open-top box shaped frame to support the print table;
    and a fringe of the frame is pressed against throughout the periphery of the linking opening so as to close the linking opening tightly when the worktable is at the sealing position.

8. The vacuum print system according to claim 7, wherein the closure door of the outer shell is in an open-bottom box shape and the open-bottom thereof forms the linking opening.

9. The vacuum print system according to claim 2, wherein the closure door of the outer shell is in an open-bottom box shape and the open-bottom thereof forms the linking opening.

10. The vacuum print system according to claim 1, wherein the worktable at the sealing position divides the first compartment above the second compartment by sealing a linking opening at a bottom of the first compartment, and the worktable is operable to move vertically between the sealing position and a waiting position beneath the linking opening and in a horizontal plane common with the work supplying position, and is also operable to move horizontally between the waiting position and the work supplying position.

11. The vacuum print system according to claim 10, wherein the worktable comprising:
    a plate-shaped print table to hold the work thereon, and
    an open-top box shaped frame to support the print table;
    and a fringe of the frame is pressed against throughout the periphery of the linking opening so as to close the linking opening tightly when the worktable is at the sealing position.

12. The vacuum print system according to claim 11, wherein the closure door of the outer shell is in an open-bottom box shape and the open-bottom thereof forms the linking opening.

13. The vacuum print system according to claim 10, wherein the closure door of the outer shell is in an open-bottom box shape and the open-bottom thereof forms the linking opening.

14. The vacuum print system according to claim 1, wherein the worktable comprises:
   a plate-shaped print table to hold the work thereon, and
   an open-top box shaped frame to support the print table;
   and a fringe of the frame is pressed against throughout the periphery of the linking opening so as to close the linking opening tightly when the worktable is at the sealing position.

15. The vacuum print system according to claim 14, wherein the closure door of the outer shell is in an open-bottom box shape and the open-bottom thereof forms the linking opening.

16. The vacuum print system according to claim 1, wherein the closure door of the outer shell is in an open-bottom box shape and the open-bottom thereof forms the linking opening.

17. A vacuum print system comprising:
   an outer shell to define an airtight inner space, and having a closure door,
   a printer provided in the airtight inner space,
   a worktable to supply the work to the printer, and provided in the airtight inner space operable to move,
   an air exhaust system connected to the airtight inner space,
   wherein
      the worktable is operable to move between a sealing position to divide the airtight inner space into two airtight compartments, a first compartment having the closure door, and a second compartment having the printer provided therein and the air-exhaust system connected thereto, and a work supplying position to supply the work to the printer,
   and the closure door is operable to open to take the work in and out when the worktable is at the sealing position.

18. The vacuum print system of claim 17, wherein the worktable at the sealing position divides the first compartment from the second compartment by sealing a linking opening at an inner surface of the first compartment, and the worktable is operable to move between the sealing position and the work supplying position.

19. The vacuum print system according to claim 18, wherein the worktable comprising:
   a plate-shaped print table to hold the work thereon, and
   an open-top box shaped frame to support the print table; and
   a fringe of the frame which is press able throughout the periphery of the linking opening so as to close the linking opening tightly when the worktable is at the sealing position.

20. The vacuum print system of claim 17, wherein an additional air exhaust system is connected to the airtight inner space at a portion which forms the first compartment when the worktable is at the sealing position, to exhaust air from the first compartment when the worktable is at the sealing position and the closure door is closed.

* * * * *